(12) United States Patent
Geist

(10) Patent No.: US 7,094,696 B2
(45) Date of Patent: Aug. 22, 2006

(54) METHOD FOR TMAH ETCHING OF CMOS INTEGRATED CIRCUITS

(75) Inventor: Jon Geist, Olney, MD (US)

(73) Assignee: Optical ETC Inc., Huntsville, AL (US)

( * ) Notice: Subject to any disclaimer, the term of this patent is extended or adjusted under 35 U.S.C. 154(b) by 501 days.

(21) Appl. No.: 10/081,963

(22) Filed: Feb. 21, 2002

(65) Prior Publication Data
US 2003/0157809 A1 Aug. 21, 2003

(51) Int. Cl.
H01L 21/302 (2006.01)
H01L 21/461 (2006.01)

(52) U.S. Cl. .................. 438/693; 438/745; 438/753
(58) Field of Classification Search ............... 438/692, 438/693, 745, 753
See application file for complete search history.

(56) References Cited

U.S. PATENT DOCUMENTS

| | | | | |
|---|---|---|---|---|
| 5,607,718 A | * | 3/1997 | Sasaki et al. | 427/97 |
| 5,817,610 A | * | 10/1998 | Honda et al. | 510/176 |
| 6,261,466 B1 | * | 7/2001 | Bayes et al. | 216/13 |
| 6,315,635 B1 | * | 11/2001 | Lin | 451/7 |
| 6,338,743 B1 | * | 1/2002 | Dusemund et al. | 51/307 |
| 6,372,055 B1 | * | 4/2002 | Montano et al. | 148/269 |

* cited by examiner

Primary Examiner—Duy-Vu N. Deo

(57) ABSTRACT

A method for preparing and using a tetramethylammonium hydroxide etchant (180). The etchant is prepared by combining precisely known quantities of the etchant components obtained from liquid sources of tetramethylammonium hydroxide (110) and dissolved silicate (115). A precise quantity of an acidic (relative to tetramethylammonium hydroxide) oxidizer is added at intervals during a long etch as well as just before immersing a sample holder (135) and sample in the etchant (180). A precise quantity of tetramethylammonium hydroxide such as can obtained from a pipette (175) is also added during long etches to compensate for the reduction in etchant pH caused by the addition of the oxidizer.

7 Claims, 3 Drawing Sheets

METHOD FOR TMAH ETCHING OF CMOS INTEGRATED CIRCUITS

BACKGROUND

1. Field of Invention

This invention relates to the processing of standard silicon integrated-circuit (IC) chips or wafers containing precursors for micro-electromechanical systems (MEMS) structures co-integrated with standard CMOS-IC control or signal processing electronics, specifically, to etching silicon chips or wafers to convert MEMS precursors into functional MEMS structures while preserving aluminum bonding pads located on the chips or wafers.

2. Description of Prior Art

CMOS-IC Foundry MEMS

Parameswaran et al., *Micromachined Thermal Radiation Emitter from a Commercial CMOS Process*, IEEE Electron Device Letters 12, 57–59 (1991), describe a method for co-integrating MEMS structures with CMOS IC's on chips fabricated in a standard CMOS process by a commercial foundry service. Both the circuits and MEMS precursors were designed with the same standard IC CAD software. A special layer called OPEN was used to define the MEMS precursors. Following completely standard fabrication at the commercial foundry, the chips were etched in a mixture of ethylenediamine, pyrocatechol, and water (EDP) to remove the silicon below the MEMS precursor. What remained was a functional MEMS structure.

The EDP etchant was heated to over 90° C. while being stirred in a retort-type etching vessel fitted with a reflux condenser. Once the etching temperature had been reached, the chips to be etched were inserted into the retort for a predetermined etching period, typically less than one hour, after which they were removed. No photolithographic or masking steps were required before the chips were put into the retort and the etch was self-limiting. Therefore, precise control of the duration of the etch was not required. When the time required to convert the MEMS precursors into functional MEMS structures was less than about one hour, then the aluminum bonding pads that were connected to the co-integrated IC's usually were not damaged too much to prevent wirebonding.

The method of Parameswaran et al. is, however, not without problems. First, EDP is a toxic material that is difficult to handle. Some of its constituents have a high vapor pressure. It also forms a mist whenever the retort is opened at temperature, and whenever EDP is poured from one container to another. Misting appears to pose the most acute inhalation hazard. Second, while EDP etches silicon much more rapidly than aluminum, it still etches aluminum at a rate great enough to completely remove the bonding pads after not much longer than one hour, and partial etching of the bonding pads during the shorter time period may reduce the reliability of the bonding pads during the life of the packaged chip. Third, EDP is very dirty. It leaves a residue on the chips that cannot be removed with a simple rinse. If a chip is rinsed a few times in deionized (DI) water and then set in a beaker of fresh DI water for a number of hours, the water will become very dark indicating removal of residue that remained after the initial rinses. If all of this residue is not adequately removed by flowing fresh DI water over the chip for many hours, the chip will deteriorate over a period of months. Finally, etching at a temperature over 90° C. is inconvenient due to its proximity to the boiling point of water.

TMAH Etchants of Schnakenberg et al.

Schnakenberg et al., *TMAH etchants for silicon micromachining*, Digest of Technical Papers, '91, IEEE Int. Conf. on Solid-State Sensors and Actuators, 815–818 (1991), reported on the etching properties of different concentrations of tetramethylammonium hydroxide (TMAH) and dissolved silicon (silicate) in water. They reported that

- they prepared their etchants by diluting commercial solutions of 25% TMAH (by weight in water) and carried out all etches at 80° C. with a reflux condenser without stirring,
- the etchant pH, which was apparently measured during etching, decreased during etching and was the most important factor affecting the etching characteristics; the etch rate depended upon pH rather than the concentrations of TMAH and silicon dissolved in the etchant,
- pyramidal hillocks bounded by (111) crystal planes formed on the etched surfaces when the etchant pH was less than 13, which corresponds to a TMAH concentration of about 20% in the absence of dissolved silicon; the density and size of the hillocks increased with decreasing pH,
- the silicon (100) etch rate was about 39 µm per hour at a pH of about 11.8, which corresponds to an undoped TMAH concentration of about 2%, and the ratio of the silicon (111) to (100) etch rate was about 0.02 at this pH,
- the silicon (100) etch rate was about 26 µm per hour at a pH of about 13, which corresponds to an undoped TMAH concentration of about 20%, and the ratio of the silicon (111) to (100) etch rate was about 0.04 at this pH,
- the silicon (100) etch rate decreased monotonically as the pH was increased from 11.8 to 13.3,
- the silicon (100) direction etch rate of TMAH is greater than that of EDP,
- the etch rate for aluminum, which was mainly influenced by the concentration of dissolved silicon in the etchant and which was controlled by doping the etchant with silicon, could be reduced to a negligible value by dissolving silicon (as silicate) in a concentration that depended upon the TMAH concentration (over 90 grams per liter at 20% TMAH by weight,
- the etch rate for the other standard layers used in CMOS integrated circuits was very low compared to the silicon (100) etch rate in the absence of dissolved silicon, and even lower in the presence of dissolved silicon, While providing some important advantages over the use of EDP, the procedure of Schnakenberg et al. also has some disadvantages. First, pH monitoring at high pH and high temperature is expensive and requires considerable care and frequent recalibration to be reliable. Secondly, hillocks formation is a serious problem because the etching process becomes unreliable. In fact, etching often ceases in the presence of hillocks, so the procedure of Schnakenberg et al. is really useful only when the pH is maintained above 13. TMAH is an expensive reagent, and using it above pH 13 requires a high concentration, which increases the etching cost significantly. Also, the selectivity against etching in the (111) direction is less than desirable at pH 13. Finally, Schnakenberg et al. didn't describe how they doped the etchant with sufficient silicon.

TMAH Etchants of Tabata et al.

Tabata et al., *Anisotropic etching of silicon in TMAH solutions*, Sensors and Actuators A34, 51–57 (1992), carried out a similar study to that of Schnakenberg et al. at four different etching temperatures, including 80° C., and came to similar though not identical conclusions. Besides reporting that they used silicon wafers, which they dissolved in the TMAH etchant, as a source of dissolved silicate, the most noteworthy differences that they reported included

- their solutions had TMAH concentrations ranging from 5% to 40% that were obtained by dilution or condensation of commercial solutions of 25% TMAH (by weight in water); unlike Schnakenberg et al., they apparently did not measure the solution pH,
- in the presence of no dissolved silicon (as silicate), the silicon (100) etch rate was about 90 μm per hour at a TMAH concentration of 5%, which is considerably greater than that reported by Schnakenberg et al.,
- in the presence of no dissolved silicon, the silicon (100) etch rate was about 60 μm per hour at a TMAH concentration of 22%, which is also considerably greater than that reported by Schnakenberg et al.,
- when the etched surfaces were covered with hillocks, the etch rate became very low,
- the etch rate at a TMAH concentration of 22% at 80° C. is less than that of EDP, which is the opposite of what Schnakenberg et al. reported,
- the aluminum etch rate showed a threshold-like behavior as a function of dissolved silicon; at low concentrations of dissolved silicon, the aluminum etch rate was comparable to that of a (100) silicon plane, and decreased by only a factor of 3 with the addition of 50 grams per liter of dissolved silicon, but decreased by a factor of 10,000 with the addition of 30 more grams of dissolved silicon.
- TMAH is non-toxic. (THIS IS DEFINITELY FALSE, but because TMAH does not mist, and because its original components are much less volatile than those in EDP, it is much easier to handle safely than EDP. Its thermal decomposition products at 130° C., trimethylamine and methanol, which may be generated to some extent during etching, are also less hazardous, relatively speaking.)
- it appears that Tabata et al. recommend use of a 22% solution of TMAH with at least 67 grams per liter of dissolved silicon operated at 90° C. for use as a silicon (100) etchant that will preserve the other layers present in standard CMOS IC fabrication processes.

Actually, the procedure of Tabata et al. is so similar to that of Schnakenberg et al. that it has most of the same disadvantages, but it does appear to eliminate the disadvantage of pH monitoring. Another disadvantage of the procedure of Tabata et al. is that it requires dissolving a silicon wafer in the TMAH solution to prepare the etchant. (Schnakenberg et al. don't report how they obtain dissolved silicon.) Dissolving a wafer is inconvenient because it takes longer than to carry out a typical etch. It is also less convenient to handle silicon wafers than to handle reagents that are available from a liquid source such as the water solution of TMAH that these authors used. Yet another disadvantage of the procedure that is apparently recommended by Tabata et al. is that the etch must be carried out at 90° C., which is less convenient than a lower temperature because it is so close to the boiling point of water.

TMAH Etchants of Klassen et al., Tea et al., and Paranjape et al.

Klassen et al., *Micromachined Thermally Isolated Circuits*, Solid-State Sensor and Actuator Workshop, 127–131 (Hilton Head, S.C., 1996), reported successfully etching chips containing co-integrated MEMS precursors and CMOS circuits with a water solution of 5% TMAH by weight, 16 grams per liter dissolved silicon, and 5 grams per liter of ammonium peroxydisulfate (APODS) for 150 minutes at 80°. They also stated that that 40 grams per liter of dissolved silicic acid (SA) can be used instead of 16 grams per liter of dissolved silicon (obtained from dissolving a silicon wafer), that between 5 and 10 grams per liter of APODS was used, and that this concentration of APODS was sufficient to prevent hillock formation during the entire etching period.

The procedure of Klassen et al. improves upon that of Tabata et al. in that it uses considerably less expensive TMAH reagent. On the other hand, dissolving SA instead of dissolving silicon wafers introduces as many problems as it solves. SA is sold as a low density powder of very fine particles of $SiO_2 \cdot xH_2O$, where x is not precisely known. Therefore, SA is not really a reagent and cannot be used as source of a precisely known quantity of SIO2 in the TMAH etchant.

Furthermore, due to the small size of the SA particles, fluffy clouds of SA have a tendency to float into the air when it is poured or scooped. Besides being an inhalation hazard, this makes it very difficult to control the quantity of SA added to the etchant, which adds to the uncertainty in the quantity of silicate in the etchant.

Tea et al., *Hybrid Postprocessing etching for CMOS-compatible MEMS*, J. of MEMS, 6, 363–372 (1997), describe a modification of the procedure of Klassen et al. The major difference is that that Tea et al. used a higher pH solution, and added 16 g of 25% TMAH and 5 g of APODS about every 35 minutes during etches that lasted longer than 35 minutes after removing the sample holder. They did not replace the sample holder until all of the APODS was dissolved about 10 minutes after it was added to the etchant.

The additional APODS was needed because the lifetime of the APODS apparently decreases with increasing pH. The additional TMAH was used to compensate for the reduction in etchant pH caused by the ammonium ion contained in the APODS. According to Tea et al., their procedure is still far from ideal, suffering the same problems with SA as the procedure of Klassen et al.

Paranjape et al., *Dual-doped TMAH silicon etchant for MEMS structures and systems applications*, J. Vac. Sci. Technolo. A18, 738–742 (2000), describe comparisons of etching with high concentration of TMAH without silicate and APODS and etching with lower concentrations of TMAH, dissolved silicate, and APODS. Like Tea they add APODS at intervals during a long etch, but they do not describe their procedure.

Paranjape et al. recommend a 5% by weight solution of TMAH with 42.5 grams per liter of SA. Their procedure is very similar to that of Klassen et al. and Tea et al., and suffers from many of the same problems. Indeed, Paranjape et al. specifically state that the correct concentration of SA needed to preserve exposed aluminum layers varied from under 20 grams per liter to over 40 grams per liter depending upon the water content of the SA. In fact, they suggested that the proper amount of SA should be determined for each experimental case, which is very inconvenient.

Silicate Chemistry

G. Lagerstroem and N. Ingri, *Equilibrium studies of polyions, IV. Silicate ions in NaCl medium*, Acta Chem. Scand. 13, 758–775 (1959) and N. Ingri and G. Lagerstroem, *Equilibrium studies of polyions, III. Silicate ions in NaClO₄ medium*, Acta Chem. Scand. 13, 722–736 (1959) point out that when silicon is dissolved in a strong base like TMAH, the resulting solutions consist of a number of different silicate species including $Si(OH)_4$, $SiO(OH)_3^-$, $SiO_2(OH)_2^{2-}$, and $Si_4O_6(OH)_6^{3-}$.

As long as the $OH^-$ concentration remains above about $2\times10^{-3}$, all species present are in solution and the kinetics are fast. If the $OH^-$ concentration falls below this value, even momentarily, a precipitate of $Si(OH)_4$ and silicate polymers will begin to form. The solution may remain clear for some time while the precipitate is forming, but will eventually become cloudy if the $OH^-$ concentration remains below about $2\times10^{-3}$. If the $OH^-$ concentration is again raised above $2\times10^{-3}$, the precipitate will redissolve, but only very slowly.

The chemical reactions among different silicate species are such that it takes more than one mole of a singly ionized base like TMAH to neutralize one mole of SA, and even more base is needed to bring the $OH^-$ concentration high enough to prevent precipitation of $Si(OH)_4$ and silicate polymers. Thus, the pH of the solution is lowered from the pH before dissolution of the SA by an amount that depends upon the concentration of each silicate species.

The net effect is that there is a small window in which the solution pH is high enough to prevent precipitation of silicate and low enough to prevent attack on exposed aluminum. This means that the procedures of Klassen et al., Tea et al., and Paranjape et al., utilizing SA as they do, will suffer from reproducibility problems because the water content of the SA cannot be accurately determined prior to etching. Not only can such problems waste an expensive reagent, but they can also ruin fully fabricated wafers, which are very expensive.

To summarize, all of these authors report contradictory results and draw different conclusions, which suggests that the preparation and use of TMAH etchants is not simple, but requires great attention to detail. Schnakenberg et al. and Tabata et al. recommend using TMAH concentrations above 20%, whereas Klassen et al., Tea et al., and Paranjape et al. recommend TMAH concentrations below 10% with APODS to prevent hillock formation. All of the authors cited above recommend using dissolved silicate to preserve exposed aluminum, but Schnakenberg et al. do not describe their source of dissolved silicate. Tabata et al. report using silicon wafers. Not only are these much less convenient than a liquid reagent, they also take a very long time to dissolve. Klassen et al., Tea et al., and Paranjape et al. report using SA as a source of dissolved silicate. Not only is SA much less convenient than a liquid reagent, but it does not deliver a reproducible quantity of dissolved silicate to the etchant. Finally, neither Klassen et al., nor Tea et al., nor Paranjape et al. describe how they add APODS, which is sold as a powder, to the etchant. Klassen et al. add APODS only once, while Tea et al. and Paranjape et al. add APODS periodically during the etch, but only Tea et al. add TMAH when they add APODS to compensate for the pH reduction caused by the APODS.

SUMMARY

In accordance with the present invention, a TMAH etchant is a solution comprising precisely known quantities of TMAH and dissolved silicate to which is added a precisely known quantity of oxidizer to etch exposed silicon while preserving exposed aluminum.

Objects and Advantages

Accordingly, the objects and advantages of the present invention are:

a. to provide TMAH etchants and procedures for using them to etch (100) silicon while preserving exposed silicon dioxide, silicon nitride, and aluminum, b. to provide TMAH etchants and procedures for using them that give reproducible results, c. to provide TMAH etchants and procedures for using them that are safe to use, d. to provide TMAH etchants and procedures for using them that are inexpensive to use, e. to provide TMAH etchants and procedures for using them that are convenient to use, f. to provide a convenient and precisely known source of dissolved silicate ions for TMAH etchants, g. to provide a liquid source of dissolved silicate for TMAH etchants, h. to provide a liquid source of oxidizer for TMAH etchants.

Still further objects and advantages will become apparent from a consideration of the ensuing description and drawings. Among the novel aspects of the present invention are the use of a colloidal suspension of silicon dioxide as a convenient and reproducible liquid source of dissolved silicate ions in a TMAH etchant, the use of a solution of APODS as a convenient and reproducible liquid source of oxidizer in a TMAH etchant.

DRAWING FIGURES

DESCRIPTION—FIGS. 1–3

Figure 1:
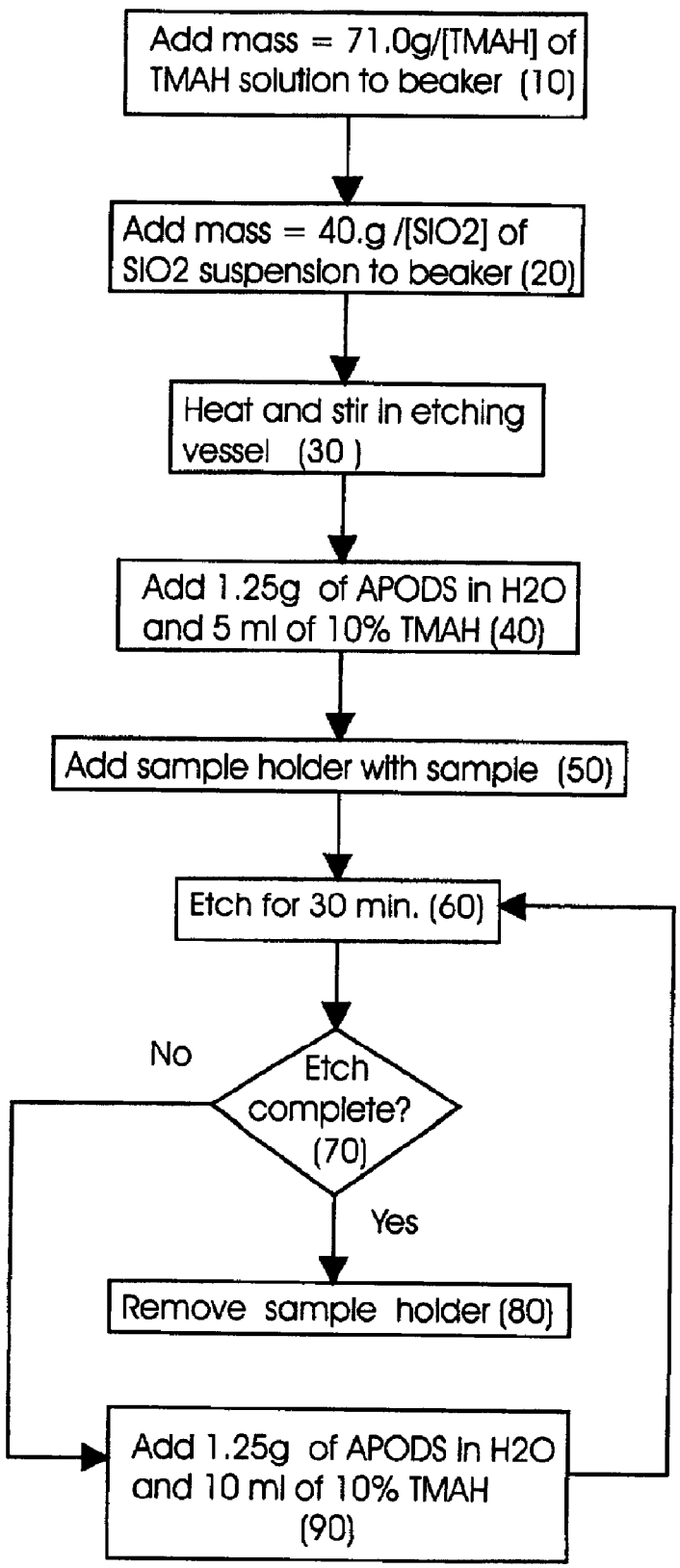
FIG. 1 is flow chart of the key steps of preferred embodiments of methods for preparing and using the TMAH etchant of this invention.

In FIG. 1, step (10), a mass of a water solution of TMAH is added to a beaker. In step (20) a mass of a water suspension of $SiO_2$ is added to the same beaker. In step (30), after the contents of the beaker have been poured into a clean etching vessel, they are heated and stirred until the $SiO_2$ dissolves. Step (40), which is the addition of 1.25 grams of APODS dissolved in 10 ml of water and 5 ml of a 10% solution of TMAH in water to the etching vessel, is carried out just before step (50), which is the immersion of the sample holder containing the sample to be etched in the etchant. In step (60) the sample is etched for 30 minutes. In step (70), the actual duration of the etch is compared with the predicted duration of the etch. If the actual duration exceeds the predicted duration, then step (80), which is removal of the sample, is carried out. If not, step (90), which is the addition of another 1.25 grams of APODS dissolved in 10 ml of water and 5 ml of a 10% solution of TMAH in water, is carried out and steps (60) and (70) are repeated.

Figure 2:
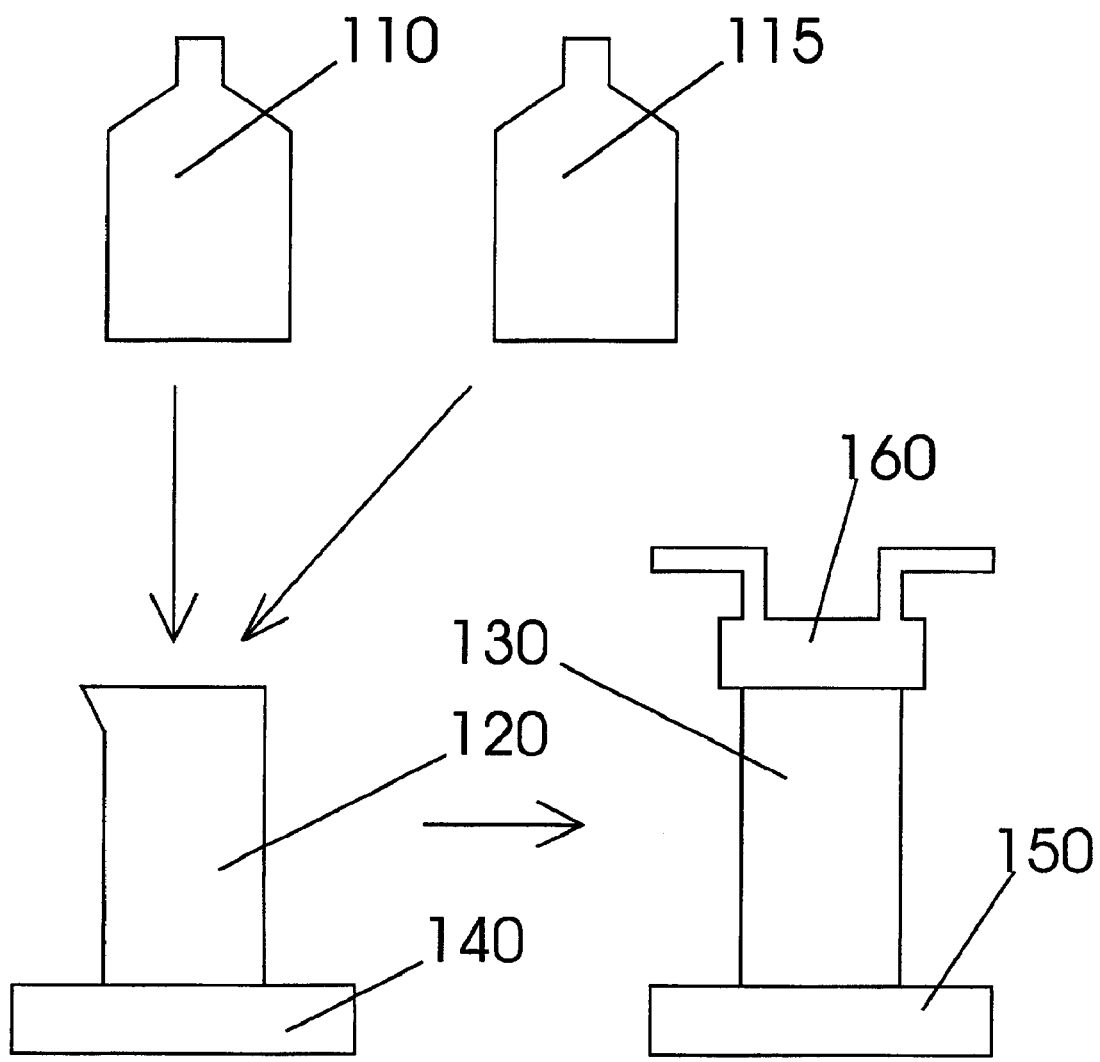
FIG. 2 illustrates the preferred embodiment of a method for preparing a TMAH etchant.

In FIG. 2, a portion of the contents of a bottle 110 of a TMAH solution in water and a portion of the contents of a bottle 115 of a colloidal suspension of $SiO_2$ in water are weighed into a clean beaker 120 on a scale 140. Water (not shown) is added, and the contents of beaker 120 are poured into a quartz etching vessel 130 containing a plastic-coated magnetic stirring bar (not shown). Etching vessel 130 is located on a magnetic-stirring hotplate 150, covered with a water cooled reflux condenser 160 whose input and output connectors are connected to a source of flowing water (not shown) through rubber hoses (not shown), and stirred and heated at 80° C. until all of the SIO2 is dissolved.

Figure 3:
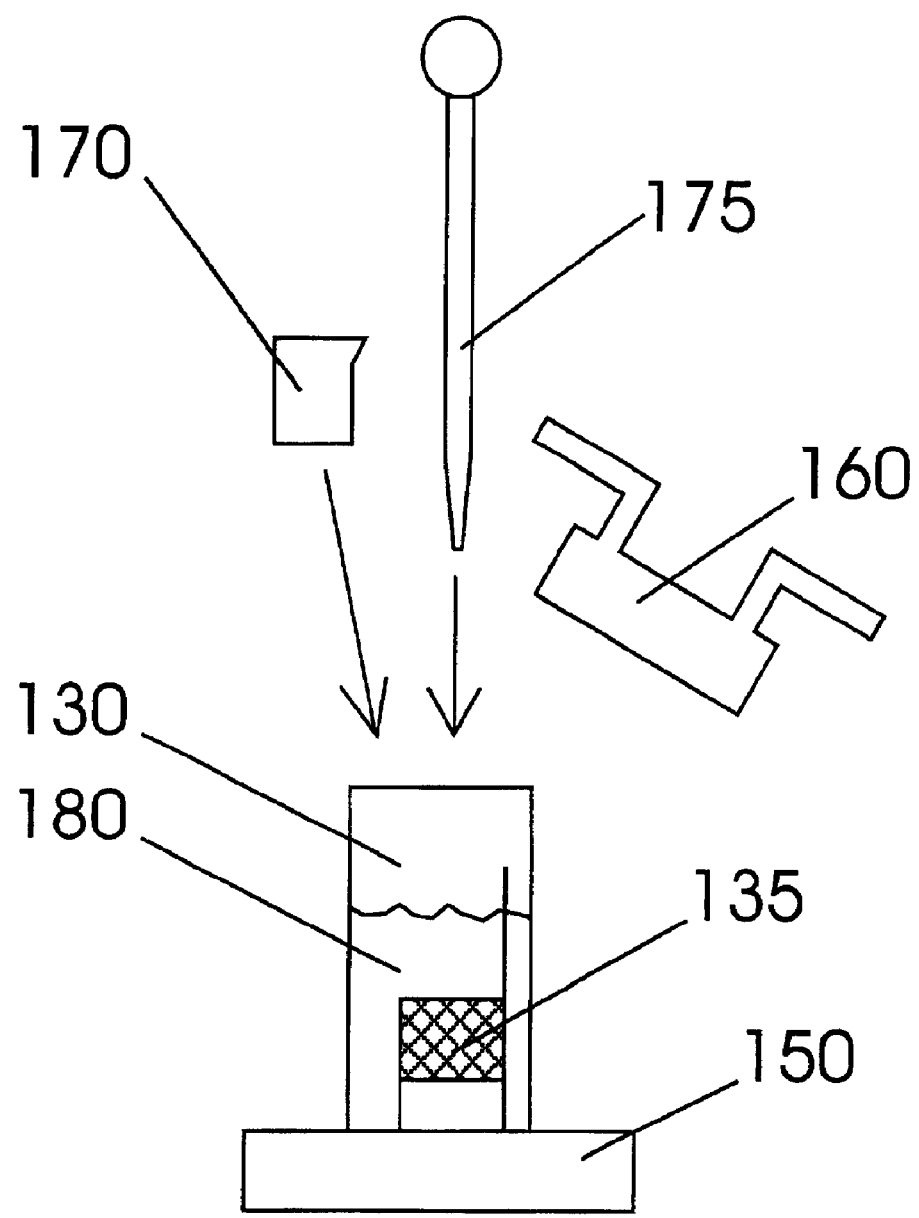
FIG. 3 illustrates the preferred embodiment of a method for adding APODS to and using the etchant of FIG. 2.

In FIG. 3, after 30 minutes of etching a sample (not shown) in a sample holder 135 located in a TMAH etchant 180 heated to 80° C. in etching vessel 130 on hotplate 150, reflux condenser 160 is removed from etching vessel 130, APODS dissolved in water is added to etching vessel 130 from beaker 170 and a TMAH solution is added to etching vessel 130 from a pipette 175. Reflux condenser 160 is then placed back in position for another 30 minutes of etching.

OPERATION—FIGS. 2–3

The acronyms, chemical formulas, and formula weights of the chemicals used in the preferred embodiment of the present invention are given in Table 1.

TABLE 1

Chemicals used in preferred embodiments of TMAH etchants
TMAH etching reagents

| Acronym | Chemical Formula | Formula Weight |
|---|---|---|
| TMAH | $N(CH_3)_4OH$ | 91.156 grams per mole |
| SIO2 | $SiO_2$ | 60.090 grams per mole |
| SI | Si | 28.090 grams per mole |
| APODS | $(NH_4)_2S_2O_8$ | 228.212 grams per mole |

Preparation of the TMAH Etchant: FIG. 2

The preferred embodiment of a method for preparing a TMAH etchant that is illustrated in FIG. 2 is summarized below:

(A) pour into beaker 130 a mass $M_{TMAH}$ of TMAH from a bottle 110 containing a nominal 10% by weight solution of TMAH in water, where $$M_{TMAH} = \frac{71.0 \text{ g}}{[TMAH]} \quad (1)$$

and [TMAH] is the concentration of the TMAH solution in grams of TMAH per gram of solution, which is available from the TMAH vendor for the lot number on the bottle, (B) pour into beaker 130 a mass $M_{SIO2}$ from a bottle 115 of a nominal 40% by weight colloidal suspension of silicon dioxide (SIO2) in water, where $$M_{SIO2} = \frac{40.0 \text{ g}}{[SIO2]}, \quad (2)$$

and [SIO2] is the concentration of the SIO2 suspension in grams of SIO2 per gram of suspension, which is available from the SIO2 vendor for the lot number on the bottle, (C) add to beaker 130 a mass of DI water given by $$M_{DIH2O} = 1000 \text{ grams} - m_{TMAH} - m_{SIO2}, \quad (3)$$

(D) bring the mixture in beaker 130 to a temperature of 80° C. and hold it at that temperature while stirring vigorously for at least 20 minutes or until it becomes completely clear, which ever is longer.

Some other details of the preferred embodiment may prove useful. Beaker 130 is placed on a scale and the scale tared (reading set to zero with the beaker in place). An un-opened bottle 110 of TMAH is selected, its lot number read from the bottle, and the concentration [TMAH] for that lot is determined. The bottom of the bottle is examined visually for material that may have precipitated out of suspension. If any is found, the bottle and its contents are discarded. Previously opened and recapped bottles can be used with complete confidence only if they are stored under nitrogen after recapping to avoid absorption of carbon dioxide, which neutralizes some of the $OH^-$ ions. Bottles containing nominal 10% by weight TMAH in a water solution, which are available commercially, are convenient liquid sources of TMAH for preparing 1 liter of etchant if provisions for storing previously opened bottles of TMAH under nitrogen are not available.

The TMAH solution is added to beaker 130 until the scale reads at least $M_{TMAH}$ (from eq. 1 above) and the actual mass $m_{TMAH}$ of solution added is recorded. If $M_{TMAH} - m_{TMAH} > 21$ grams, then either some of the solution is withdrawn from the beaker with a clean pipette or (rarely) the solution is discarded.

A bottle 115 of SIO2 suspension is selected and its concentration [SIO2] is determined. The inside surface of the bottle is examined visually for material that has precipitated out of suspension. If any is found, the bottle and its contents are discarded. Bottles containing nominal 40% by weight SIO2 in a colloidal suspension in water, which are available commercially, are convenient liquid sources of dissolved silicate ions.

After addition of the TMAH solution to beaker 130, the scale is retared, the SIO2 suspension is added to the beaker until the scale reads at least $M_{SIO2}$, and the actual mass $m_{SIO2}$ of suspension added is recorded. If $M_{SIO2} - m_{SIO2} > 3$ grams, then the solution is discarded. Also, if a significant quantity of TMAH solution or SIO2 suspension is spilled on the weighing surface of the scale during this procedure, then the beaker contents are discarded, the beaker and scale cleaned, and the procedure repeated.

A difference defined as $$D = m_{TMAH}[TMAH] - 1.331 \, m_{SIO2}[SIO2] - 17.75 \text{ grams} \quad (4)$$

is calculated. If D>1 gram, then a mass $$\Delta m_{SIO2} = \frac{0.751 \, M_{TMAH}[TMAH] - 13.33 \text{ grams}}{[SIO2]} - m_{SIO2} \quad (5)$$

of the SIO2 suspension is added to the beaker. If D<1 gram, then a mass $$\Delta m_{TMAH} = \frac{1.331 \, M_{SIO2}[SIO2] + 17.75 \text{ grams}}{[TMAH]} - m_{TMAH} \quad (6)$$

of the TMAH solution is added to the beaker.

If it is determined that additional mass of either SIO2 or TMAH is needed, it withdrawn from the appropriate bottle with a clean pipette and added to the beaker after the scale has been retared. The difference D is then recalculated. With sufficient care, the recalculated difference D will be less ±1 gram. Otherwise, a second adjustment can be made following the same procedure.

The mass of DI water required by eq. 3 is weighed into the beaker after retaring the scale and the etchant is poured into an etching vessel located on a variable-temperature, rotating-magnet hot plate that is capable of maintaining the liquid in the etching vessel within a few degrees Celsius of a preset temperature. An accuracy of ±20 grams of water is sufficient for this step because the pH of the resulting solution is much less sensitive to the water mass than to the TMAH and SIO2 masses. The preferred etching vessel is a retort fitted with a flowing-water reflux-condenser cover, an immersion thermometer, and a plastic-encapsulated magnetic stirring bar. The hot plate is adjusted to bring the mixture to 80° C. and the stirring is set to the practical maximum.

A colloidal suspension of silicon dioxide in water is used as the source of dissolved silicon (as silicate) because, as a liquid source of reagent, it is easy to handle and because accurate values of the silicon dioxide concentration [SIO2] are available from the vendor. The etchant is heated for at least 20 minutes after reaching 80° C. to assure that all of the colloidal silicon dioxide dissolves in the TMAH to produce silicate ions. If the etchant does not become clear, some of the colloidal silicon is still in suspension, and the pH may be too high, or something else may be wrong. In any case, the etchant should be discarded in this event because it may not produce the desired results.

Equations 6 and 5 are inverse linear approximations to nonlinear iso-pH curves that describe the etchant solution after it has been heated long enough to dissolve all of the colloidal silicon dioxide. These curves must be considered approximate because they were calculated from iso-pH curves that were calculated from the data of G. Lagerstroem and N. Ingri, which were obtained at a different temperature and in the presence of different non-silicate species than prevail in the etchant.

Because the iso-pH curves are nonlinear, simple proportions cannot be used to calculate how much additional TMAH or SiO2 is needed to correct the as-prepared etchant when D in eq. 4 differs from zero by much more than 1 g. Even eqs. 6 and 5 may be unreliable if D is much larger than about 5 g due to the nonlinearity of the buffering action and the use of data obtained under different physical and conditions in the derivation of the curves.

Preferred Embodiment for Adding APODS and etching—FIG. 3

The preferred embodiment of the procedure illustrated in FIG. 3 for adding APODS and the sample holder and sample requiring etching to a TMAH etchant is summarized below:

(A) approximately 10 ml of DI water is added to a small, clean beaker 170, (B) 1.25 grams of powdered APODS is added to beaker 170, and mixed by swirling until it is completely dissolved. If it does not dissolve completely in less than 2 minutes, or if it bubbles vigorously during mixing, it is discarded, and the procedure restarted at step (A), possibly with a new or cleaner beaker.

(C) the contents of beaker 170 are poured into the TMAH etchant in etching vessel 130, (D) 5 ml of a nominal 10% TMAH in water solution is added to the etching vessel 130 with a pipette 175 graduated to 0.1 ml.

Without the addition of an oxidizer such as APODS, the silicon-etch rate of the above described etching solution may be unsatisfactorily slow due to the formation of hillocks. No APODS is added until the TMAH etchant has reached 80° C. and become completely clear, which indicates that all of the colloidal silicon dioxide has dissolved. Furthermore, no APODS is added until just before etching is to commence.

Before the sample holder and sample are immersed in the etching vessel, they can be dipped in buffered hydrofluoric acid for about 5 to 10 seconds to remove native oxide on the silicon, but if this is done they should be rinsed thoroughly in DI water before immersion in the etchant. As soon as practical after the addition of APODS and TMAH, the sample holder containing the sample to be etched is immersed in etching vessel 130.

Under the conditions of this embodiment, exposed silicon will be etched at a nominal rate of 1 μm per minute. If the desired etch depth is greater than 30 μm, then Steps (A) through (D) are repeated at 30 minute intervals until the nominal time required for the desired etching depth has been reached. Each 30 minute etching period is called a mini-etch. After the nominal etching time has elapsed, the sample is removed, rinsed clean, and examined. If the etch is not complete, then steps (A) through (D) are repeated, and the procedure is continued.

The TMAH etchant prepared and/or used as disclosed here can be stored in a covered etching vessel over night and used the next day following the same procedure after it is heated to 80° C. For example, three mini-etches have been successfully carried out on one day and three more a day later or sometimes two or three days later, but only when the third mini-etch on the first day was quite free of particles. On the other hand, it is almost certainly necessary to store the etchant under nitrogen to prolong its optimum performance beyond a few days.

Sometimes after six or less mini-etches, the etchant has become noticeably yellow and a number of silicate precipitates can be observed floating in the etchant. The etchant is usually discarded at this point, but more than 10 successful mini-etches have been carried out before replacing the etchant on a few occasions. Also, with an early variation of the embodiment described here, no deterioration of aluminum bonding pads was observed on a chip that had been etched for a total of six hours (18-twenty minute mini-etches), but the etchant was usually discarded after 3 or 4 mini-etches, and always after 6 mini-etches.

Dissolved APODS is added to the etchant every 30 minutes because the peroxydisulfate ions spontaneously decomposes into sulfate ions at a rate that increases with pH at the etchant temperature. At the target pH and temperature almost all of the peroxydisulfate ions will have decomposed after 30 minutes. Once they have all decomposed, hillock formation may commence, drastically reducing the etch rate, and possibly causing it to vary from structure to structure on a chip or from chip to chip on a wafer. On the other hand, when the pH is low enough to give the APODS a substantially longer lifetime, it is too low to prevent occasional problems with silicate precipitation during etching. This can also cause the etch rate to vary from structure to structure.

TMAH is added when APODS is added to maintain the pH of the etchant. APODS is an acid relative to TMAH due to the ammonium ion present in the APODS. Some of the free ammonium ions ($NH_4^+$) that form when the APODS dissolves combine with hydroxide ions ($OH^-$) to form dissolved ammonia and water. This reduces the pH of the etchant, but the added TMAH compensates for this effect.

If every ammonium ion from the APODS combined with a hydroxide ion to form water, then addition of 3.75 grams APODS to the etchant without any additional TMAH would decrease the etchant pH out of the target region. Furthermore, if every ammonium ion from the APODS combined with a hydroxide ion to form water, then ten additions of 1.25 grams APODS and ten additions of 10 ml of 10% TMAH (rather than 5 ml as specified above) for a total of 100 ml 10% TMAH and 12.5 grams APODS should preserve the pH of the preferred embodiment of the etching solution. This, however, is not what was observed.

Instead, 10 mini-etches during which a total of 12.4 grams of APODS and 92 ml of TMAH were added, resulted in complete destruction of all exposed aluminum layers on the sample being etched. One possible explanation is that some of the ammonium ions remain ionized at this combinations of temperature and reagent pH, but this is not the only explanation. Because silicate precipitation, which is sometimes observed during the addition of APODS and the use of the etchant, requires protons, it is possible that silicate-precipitate formation rather than incomplete conversion of the ammonium ions to dissolved ammonia causes the increase in pH of the etchant following the addition of 12.4 grams of APODS and 92 ml of 10% TMAH over a period of about 5 hours.

Finally, the target concentrations are at the high pH end of the window between serious silicate precipitation and the threshold for aluminum damage. There are two reasons for this. First, increasingly serious problems with silicate precipitation have been encountered as the TMAH concentration was lowered or the SIO2 concentration increased from the target concentrations. Second, it was observed that the vertical etch rate for silicon remained fairly constant around the target concentrations, but that the under-etch rate for trampoline-type structures increased significantly with increasing pH.

CONCLUSIONS, RAMIFICATIONS, AND SCOPE

Accordingly, the reader will see that the use of liquid sources of SIO2 and APODS as well as a liquid source of TMAH not only simplifies preparation of a TMAH etchant, but also provides a TMAH etchant having precisely known concentrations of reagents. The reader will also see that the addition of an oxidizer such as APODS and additional TMAH to compensate for the reduction of pH caused by the APODS allows the etch to be carried out in a small window of pH and reagent concentrations that produces a highly optimized combination of a high (100) silicon etch rate, a very low aluminum etch rate, negligible silicate precipitation, an excellent selectivity against etching of the other standard CMOS layers, a good selectivity against etching (111) silicon, a lower TMAH concentration, which reduces the etchant cost.

The reader will also understand that if oxidizer is not added during the etching period, hillocks may form before the etch is completed. Whereas using a lower pH etchant may increase the lifetime of the oxidizer, it will also decrease the under-etch rate and increase the potential for problems with silicate precipitation. Whereas increasing the pH sufficiently to prevent hillock formation without APODS is possible while preserving the resistance of aluminum layers to the etchant, it requires increasing the concentrations of both TMAH and dissolved silicate and will require much more TMAH, which increases the etchant cost, and will also reduce the (100) silicon etch rate and the selectivity against etching (111) silicon.

The reader will also see that a colloidal suspension of SIO2 provides a highly optimized combination of convenience and control of the concentration of the dissolved silicate in the etchant of this invention. Any mass of dissolved silicate that is needed for any given etching job can be conveniently obtained from a bottle of colloidal SIO2 and this reagent can be stored indefinitely. Moreover, the precise knowledge of the concentration of SIO2 in the colloidal suspension makes it possible to prepare the reagent concentrations and pH in the narrow window of optimum etchant performance that is described above. This level of precision is not available from SA because the water fraction is not precisely known.

Similarly, the level of convenience provided by a colloidal suspension of SIO2 is not available with silicon wafers. If whole wafers are dissolved, then their mass determines the quantity of etchant that must be prepared. Any extra etchant beyond what is needed must either be discarded or stored under nitrogen. Alternatively, the wafers must be iteratively broken and weighed to obtain the required mass of silicon. And it takes much longer to dissolve the wafers than to carry out a typical etch.

Persons of ordinary skill in laboratory chemistry will be able to adjust the formulas given here to produce the required volume of etchant by changing all masses from grams to grams per liter (g/l). Similarly, they will be able to calculate the proper masses of other concentrations of TMAH and SIO2 to use if concentrations different from those given here are more convenient for some particular etching application. They will also be able to calculate the proper mass of other peroxydisulfate salts or other oxidizers to use in place of APODS. In the case of many of the salts, no additional TMAH will needed because the salts will not neutralize hydroxide ions. On the other hand, many of these salts are not generally compatible with CMOS integrated circuits.

When large volumes of silicon are being etched in relatively small volumes of etchant during each mini-etch, the composition of the etchant may fall outside the target range, due to the build up of dissolved silicon. In this case, it is necessary to add TMAH occasionally to maintain the composition of the etchant in the target range. Persons of ordinary skill in chemistry will be able to calculate the concentration of dissolved silicon as a function of the depth of the etch, to calculate the equivalent concentration of dissolved SIO2, and to use the latter with the equations given here to calculate when to add TMAH and how much to add.

Different CMOS-IC foundries prepare aluminum layers with different thicknesses and somewhat different alloy compositions. The preferred embodiment described here, which was optimized for CMOS chips from a particular foundry, may not be optimum for chips or wafers from a different foundry. Therefore, experimentation with different reagent concentrations starting with the combinations given here may produce a more optimum combination for wafers or chips from any particular foundry process. Similarly, variations of type, quantity, or timing of the addition of oxidizer during etching may be more suitable to different etching applications.

It is also possible to reduce the target TMAH concentration or raise the target SIO2 concentration. As mentioned previously, this will reduce the under-etch rate for structure like trambolines that are not released by etching solely along the (100) direction and it will increase the potential for problems with silicate precipitation. On the other hand, it will also reduce the potential for attack on exposed aluminum layers, which may be worth the trade off. Similarly, a small increase in the target concentrations of TMAH or reduction in the target concentration of SIO2 is probably possible if extreem care and control are exercized.

Although the description above contains many specifications, these should not be construed as limiting the scope of the invention but as merely providing illustrations of some of the presently preferred embodiments of this invention. Thus the scope of the invention should be determined by the appended claims and their legal equivalents, rather than by the examples given.

I claim:

1. A method for preparing an etchant comprising:
   providing a solution of tetramethylammonium hydroxide in water;
   mixing a liquid source of silicate ions is mixed with said solution;
   adding an oxidizer to said solution at a time later than 10 minutes following immersion of a sample comprised of silicon in solution in order to produce an etchant.

2. The method of claim 1, wherein said oxidizer is ammonium peroxydisulfate.

3. The method of claim 1, wherein said oxidizer is obtained from a liquid source of oxidizer.

4. The method of claim 3, wherein said liquid source of oxidizer is a solution of ammonium peroxydisulfate in water.

5. The method of claim 1, wherein a quantity of tetramethylammonium hydroxide is added to said etchant at a time later than ten minutes following immersion of said sample in said etchant.

6. The method of claim 5, wherein said quantity of tetramethylammonium hydroxide is sufficient to maintain the pH of said etchant substantially above the threshold for silicate precipitation.

7. The method of claim 1, wherein said liquid source of dissolved silicate ions is a colloidal suspension of silicon dioxide.

* * * * *